United States Patent
Kobayashi et al.

(10) Patent No.: US 7,304,622 B2
(45) Date of Patent: Dec. 4, 2007

(54) GATE DRIVER FOR AN ACTIVE MATRIX LIQUID CRYSTAL DISPLAY DEVICE

(75) Inventors: Yasuhiro Kobayashi, Tottori (JP); Keiichi Rembutsu, Tottori (JP); Satoru Hiraga, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 442 days.

(21) Appl. No.: 10/517,766

(22) PCT Filed: Dec. 25, 2003

(86) PCT No.: PCT/JP03/16832

§ 371 (c)(1),
(2), (4) Date: Dec. 23, 2004

(87) PCT Pub. No.: WO2004/061813

PCT Pub. Date: Jul. 22, 2004

(65) Prior Publication Data

US 2005/0248550 A1    Nov. 10, 2005

(30) Foreign Application Priority Data

Dec. 27, 2002    (JP) .............................. 2002-378777

(51) Int. Cl.
  *G09G 3/36* (2006.01)
(52) U.S. Cl. .............................. 345/87; 345/91; 345/94
(58) Field of Classification Search ........ 345/204–206, 345/208–210, 55, 69, 87–98
See application file for complete search history.

(56) References Cited

U.S. PATENT DOCUMENTS 5,748,165 A * 5/1998 Kubota et al. ................ 345/96
7,002,542 B2 * 2/2006 Lee ............................. 345/94

FOREIGN PATENT DOCUMENTS

| JP | 2-74989 | 3/1990 |
| JP | 6-3647 | 1/1994 |
| JP | 9-101502 | 4/1997 |
| JP | 2000-137247 | 5/2000 |

* cited by examiner

*Primary Examiner*—Alexander Eisen
*Assistant Examiner*—Jason M Mandeville
(74) *Attorney, Agent, or Firm*—Arent Fox LLP

(57) ABSTRACT

An active matrix type liquid crystal display device capable of reducing power consumption and eliminating switching loss so as not to cause surge when stepwise changing the gate pulse supplied to a gate line during selection. The device includes, as the selection voltage supply circuit (18), a first power source (VGH0) for supplying a predetermined selection voltage and a second power source (VANA) for supplying voltage lower than the selection voltage by a predetermined value, so that voltage from the second power source is always applied to an output point (VG1) of the selection voltage supply circuit and voltage from the first power source is superimposed during a time shorter than the selection period from the beginning of the selection time, thereby applying stepwise gate pulses (GPn, GPn+1, GPn+2, . . . ) to the predetermined selected gate lines (Xn, Xn+1, Xn+2, . . . ).

6 Claims, 8 Drawing Sheets

US 7,304,622 B2

GATE DRIVER FOR AN ACTIVE MATRIX LIQUID CRYSTAL DISPLAY DEVICE

TECHNICAL FIELD

The present invention relates to an active matrix type liquid crystal display device, such as a liquid crystal panel, and in particular to an active matrix type liquid crystal display device that is provided with a gate pulse feeder for a pixel transistor connected to a liquid crystal pixel.

BACKGROUND ART

First, a typical configuration of a conventional active matrix type liquid crystal display device will be described briefly with reference to FIG. 5, which is an equivalent circuit diagram schematically showing a portion thereof corresponding to one pixel. An active matrix type liquid crystal display device has a liquid crystal panel (not illustrated), which has liquid crystal pixels arrayed in a matrix (for example, composed of A columns and B rows (where A and B are natural numbers)), with each liquid crystal pixel located at the intersection between a gate line PXn (where n is a natural number equal to or smaller than A) and a signal line (source line) Ym (where m is a natural number equal to or smaller than B) on the liquid crystal panel. This liquid crystal pixel is represented equivalently by a liquid crystal capacitance $C_{LC}$. Usually, in parallel with the liquid crystal capacitance $C_{LC}$ is connected an auxiliary capacitance $C_S$. One end of the liquid crystal capacitance $C_{LC}$ is connected to a pixel transistor Tr for driving the pixel, and the other end of the liquid crystal capacitance $C_{LC}$ is connected to a common electrode so as to receive a predetermined reference voltage Vcom.

The pixel transistor Tr is built as an N-channel TFT (thin-film transistor) of an insulated-gate field-effect type, with the drain electrode D thereof connected to the signal line Ym to receive an image signal Vsig, and with the source electrode S thereof connected to one end of the liquid crystal capacitance $C_{LC}$, i.e., to the pixel electrode. The gate electrode G of the pixel transistor Tr is connected to the gate line PXn so as to receive a gate pulse having a predetermined gate voltage Vgate. Between the liquid crystal capacitance $C_{LC}$ and the gate electrode G is formed a coupling capacitance $C_{GS}$. This coupling capacitance $C_{GS}$ is the sum of the floating capacitance between the pixel electrode and the gate line PXn and the parasitic capacitance between the source region and gate region inside the pixel transistor Tr, the latter, namely the parasitic capacitance, being dominant and considerably varying from one pixel transistor Tr to another.

Now, the voltage waveforms observed at relevant points within the single pixel shown in FIG. 5 will be described with reference to FIG. 6. In FIG. 6, the lapse of time is taken along the horizontal axis, and, with respect to the pixel transistor Tr corresponding to that single pixel, the voltage waveform at the gate electrode G thereof (represented by the solid line 200 in FIG. 6) and the voltage waveform at the source electrode S thereof (represented by the solid line 201 in FIG. 6) are plotted relative to the reference voltage Vcom.

First, during the selection period of the pixel, when a gate pulse with a voltage Vgate is applied to the gate electrode G, the pixel transistor Tr turns on. At this point, the image signal Vsig fed from the signal line Ym is written via the pixel transistor Tr to the liquid crystal pixel, with the result that the potential at the source electrode S becomes equal to Vsig, achieving so-called sampling. Next, during the nonselection period of the pixel, the gate pulse ceases to be applied, and instead a low-level gate voltage is applied, causing the pixel transistor Tr to turn off. The written image signal, however, is held by the liquid crystal capacitance $C_{LC}$.

Here, the low-level gate voltage is a voltage that is lower than the voltage Vgate so that, when applied to the gate electrode G of the pixel transistor Tr, it causes it to turn off. With respect to a given pixel, the period of time from the start of the selection period of that pixel through the nonselection period thereof until the selection period thereof starts again is referred to as one field.

At the transition from the selection period to the nonselection period, the gate pulse, which is a square wave, abruptly falls from a high level to a low level. This causes the electric charge stored in the liquid crystal capacitance $C_{LC}$ to be instantaneously discharged through the coupling capacitance $C_{GS}$ described above. This produces a voltage shift $\Delta V1$ in the image signal Vsig written to the liquid crystal pixel. That is, the voltage at the source electrode S lowers by $\Delta V1$. Since the coupling capacitance $C_{GS}$ varies from one pixel to another in the liquid crystal display device, the voltage shift $\Delta V1$ also varies accordingly. Thus, the $\Delta V1$ drop in the voltage eventually produces a periodic variation in the screen displayed on the liquid crystal panel, resulting in so-called flickers and afterimages, which remarkably degrade the display quality.

Incidentally, in a liquid crystal pixel, an image signal is written thereto during the selection period thereof, and, during the subsequent nonselection period thereof, the written image signal is held. This makes up a field. The transmissivity of a liquid crystal pixel during one field is determined by the effective voltage that is applied to the liquid crystal during that period. Accordingly, the pixel transistor Tr there needs to be designed to permit the passing therethrough of an on-state current that is needed to complete the write operation within the selection period. Moreover, to obtain a sufficiently high effective voltage to keep the liquid crystal pixel lit during the period of one field, the pixel transistor Tr needs to be designed to permit as little leak current as possible during the nonselection period (or holding period). The variation of the effective voltage is more influenced by the nonselection period, which lasts far longer than the selection period. Thus, the aforementioned voltage shift $\Delta V1$, which occurs when, after the charging of the liquid crystal capacitance $C_{LC}$, the pixel transistor Tr turns off, greatly influences the effective voltage that is applied to the liquid crystal, degrading the display quality of the liquid crystal panel.

A conventional approach to reducing the absolute value and variation of the voltage shift $\Delta V1$ is to give a comparatively high capacitance to the auxiliary capacitance $C_S$, which is connected in parallel with the liquid crystal capacitance $C_{LC}$. The purpose is to permit the auxiliary capacitance $C_S$ to store in advance sufficient electric charge to compensate for the electric charge that is discharged through the coupling capacitance $C_{GS}$. This approach has a disadvantage: the auxiliary capacitance $C_S$ is formed in the liquid crystal pixel region, and therefore increasing its size results in sacrificing the pixel aperture ratio, leading to insufficient display contrast.

An example of a solution to this problem of the voltage shift in a conventional active matrix type liquid crystal display device is disclosed in Japanese Patent Application Laid-Open No. H6-3647 (hereinafter referred to as "Patent Publication 1"). FIG. 7 shows, with respect to the pixel transistor Tr, the voltage waveform at the gate electrode G thereof (represented by the solid line 300 in FIG. 7) and the voltage waveform at the source electrode S thereof (represented by the solid line 301 in FIG. 7) plotted relative to the reference voltage Vcom, as observed when the technique disclosed in Patent Publication 1 is adopted.

According to the technique disclosed in Patent Publication 1, as shown in FIG. 7, immediately before the transition from the selection period to the nonselection period, the voltage level applied to the gate electrode G is first lowered to a second high-level gate voltage Vgate2 that is lower than a first high-level gate voltage Vgate1, and is then made to fall further to a low-level gate voltage to produce a gate pulse PGP. In this way, the voltage shift (ΔV2 in FIG. 7) in the image signal Vsig written can be reduced.

The timing with which the voltage level of the gate pulse PGP is lowered from the first high-level gate voltage Vgate1 to the second high-level gate voltage Vgate2 is on completion of the write operation so as not to influence the write operation to the liquid crystal pixel during the selection period. Specifically, the voltage fed as the gate pulse PGP to the gate electrode G is first lowered from the first high-level gate voltage Vgate1 to the second high-level gate voltage Vgate2, and is then, after transition to the nonselection period, made to fall further to the low-level gate voltage. This reduces the potential difference between the gate line PXn and the source electrode S at the time point of transition from the selection period to the nonselection period, and thus permits effective reduction of the voltage shift (ΔV2 in FIG. 7) (that is, the voltage shift ΔV2 can be made smaller than the voltage shift ΔV1).

Now, a practical example of the drive circuit adopted in Patent Publication 1 mentioned above for driving an active matrix type liquid crystal display device will be described with reference to FIG. 8. In FIG. 8, the active matrix type liquid crystal display device has a display section including liquid crystal pixels LP arrayed in a matrix and pixel transistors Tr that drive those liquid crystal pixels LP respectively. In FIG. 8, such components as are found also in FIG. 5 are identified with the same reference symbols, and their explanations will not be repeated. In FIG. 8, only the liquid crystal pixels that correspond to one row are shown.

The gate electrodes G of the pixel transistors Tr are connected, through gate lines PX1, PX2, PX3, PX4, . . . respectively, to a vertical scanning circuit 101. Through these lines, gate pulses PGP1, PGP2, PGP3, PGP4, . . . are applied, sequentially through one line after another, to the respective pixel transistors Tr so that one of them is selected at a time. The drain electrodes D of the pixel transistors Tr are connected through a signal line Ym to a horizontal drive circuit 102 so that an image signal Vsig is written, through the currently selected pixel transistor Tr, to the corresponding liquid crystal pixel LP.

The vertical scanning circuit 101 is built as a shift register 103. This shift register 103 has D flip-flops 104 connected in multiple stages, each D flip-flop 104 being composed of a pair of inverters 105 and 106 of which the output terminals are connected together. Each inverter is connected through a P-channel drive transistor 107 to the mid point between a pair of serially connected voltage-division resistors R101 and R102, and is connected through an N-channel drive transistor 108 to ground. This pair of drive transistors 107 and 108 drives the inverters 105 and 106 by being made to conduct in response to shift clock pulses VCK1 and VCK2 and the inverted versions of these pulses.

The output terminals, connected together, of the pair of inverters 105 and 106 are connected to the input terminal of a third inverter 109, and the output pulse of the D flip-flop of each stage appears at the output terminal of the third inverter 109. The output pulse is used as the input to the D flip-flop of the next stage. When a start signal VST is fed to the D flip-flop of the first stage, the shift register 103 outputs, sequentially from one stage thereof after another, output pulses that are half a period out of phase with one another. The output pulse from each stage and the output pulse from the preceding stage are subjected to the logic operation performed by a NAND gate element 110, and is then inverted by an inverter 111. In this way, the gate pulses PGP1, PGP2, PGP3, PGP4 are obtained.

The serially connected voltage-division resistors R101 and R102 are, at one end, connected to a source voltage VVDD, and, at the other end, connected through a switching transistor 114 to ground. A control voltage VCKX is periodically applied to the gate electrode of the switching transistor 114. When the switching transistor 114 is off, the source voltage VVDD is fed as it is to the shift register 103, so that the voltages of the gate pulses PGPn (where n is a natural number) are all equal to the source voltage. By contrast, when the switching transistor 114 turns on, a voltage obtained through voltage division by the factor of the resistance ratio of the resistors R101 and R102 is fed to the shift register 103, so that the voltages of the gate pulses PGPn become accordingly lower.

In this example, the control voltage VCKX that is applied to the gate electrode of the switching transistor 114 shows pulse-like level shifts according to the horizontal synchronizing signal. In this example, the horizontal period is set at 63.5 µs, and this period corresponds to the selection period of one gate line. At the very end of each horizontal period, the control voltage VCKX turns to a high level and remains thereat for a period of 6 to 8 µs. This period is so set as not to influence the write operation of the image signal during the selection period. Specifically, it is on completion of the writing of the image signal to all the pixels on the selected gate line, which proceeds sequentially to one pixel after the another, that the control voltage VCKX turns to a high level. When the control voltage VCKX turns to a high level, the switching transistor 114 turns on, with the result that the level of the supply voltage fed to the shift register 103 lowers, for example, from the level of the source voltage VVDD, which is set equal to the first high-level gate voltage, namely 13.5 V, to that of the second high-level gate voltage, which is set at about 8.5 V. The amount of voltage lowering here can be appropriately set by appropriately setting the resistance ratio of the pair of voltage-division resistors R101 and R102.

In response to this change in the supply voltage, for example, the n-th (where n is a natural number) gate pulse PGPn changes its level stepwise from 13.5 V to 8.5 V within one horizontal period. In the next horizontal period, a gate pulse PGPn+1 corresponding to the (n+1)th gate line is generated, and this gate pulse likewise changes its level stepwise. Through operations like these, the vertical scanning circuit, immediately before making the voltage level applied as each gate pulse PGPn fall, first lowers the voltage level of the gate pulse PGPn and then makes it fall further. In this way, the voltage shift in the image signal Vsig written to the pixel can be reduced.

As described above, with the technique disclosed in Patent Publication 1 mentioned above, by making the gate pulse PGPn fall stepwise, it is possible to effectively reduce the voltage shift ΔV2 in the image signal Vsig.

However, in the above described practical example disclosed in Patent Publication 1, the gate pulse PGPn that falls stepwise is produced by varying between the source voltage VVDD and the voltage VVDD×R102/(R101+R102) the supply voltage fed to the shift register 103 functioning as a gate driver. As a result, the circuit including the shift register 103 as a whole has a complicated, large-scale circuit configuration, and requires large amount of current to operate. Thus, the driver occupies a large area.

Moreover, a voltage obtained by dividing the source voltage VVDD with the resistors R101 and R102 is used as the supply voltage to the shift register 103, and this divided voltage shows high current dependence. This tends to make unstable the supply voltage to the shift register 103 and the voltage of the gate pulse PGPn.

Moreover, every time the supply voltage to logic elements such as the shift register 103 is switched by turning the switching transistor 114 on and off, a surge voltage appears in the voltage of the gate pulse PGPn, degrading the display quality. In addition, whereas logic elements such as the shift register 103 usually operate from a supply voltage of 5 V or less, in this example they are made to operate from a far higher voltage, for example 13.5 V to 8.5 V, resulting in extremely high power consumption.

DISCLOSURE OF THE INVENTION

In view of the conventionally encountered problems described above, it is an object of the present invention to provide an active matrix type liquid crystal display device that operates with low power consumption, that has a simple circuit configuration, that achieves switching without producing a surge voltage, that produces stably stepwise shifting gate pulses, and that thus offers good display quality.

To achieve the above object, according to the present invention, an active matrix type liquid crystal display device is provided with: pixel electrodes that are arranged in a matrix and that are driven by pixel transistors respectively; a plurality of gate lines that are connected, in a column-by-column fashion, to the gate electrodes of the pixel transistors; a plurality of source lines that are connected, in a row-by-row fashion, to the source electrodes of the pixel transistors; a gate driver that, sequentially during one selection period after another, connects one of the gate lines after another to the output point of a selection voltage feed circuit; and a source driver that feeds an image signal to the source lines. Here, the selection voltage feed circuit has a first power source for feeding a predetermined selection voltage and a second power source for feeding a voltage lower than the predetermined selection voltage. Moreover, the output point of the selection voltage feed circuit is always fed with the voltage from the second power source. Furthermore, a switch is provided that so operates that, during a time span that starts at the beginning of every selection period and lasts shorter than the selection period, the output point of the selection voltage feed circuit is fed with the voltage from the first power source.

With this configuration, it is possible to apply a stepwise gate pulse voltage during the selection period of each gate line. This makes it possible to solve the problem of the voltage shift ($\Delta V1$ in FIG. 6) in a conventional active matrix type liquid crystal display device. In addition, since the second voltage, which is lower than the predetermined selection voltage, is always fed to the selection voltage feed circuit, even if the voltage fed to the gate lines is switched with the wrong timing, no surge voltage appears, nor does the voltage fail to be applied.

Moreover, since the first and second power sources are provided independently of each other, stable voltages are fed to the output point of the selection voltage feed circuit, with the result that it is possible to feed stepwise gate pulses with stable voltages.

According to the present invention, in the configuration described above, the second power source may be connected via a diode to the output point of the selection voltage feed circuit. With this configuration, when the voltage from the first power source, which is higher than the voltage from the second power source, starts to be applied, the output voltage of the selection voltage feed circuit is immediately switched to the voltage fed from the first power source. Thus, it is possible to feed stepwise gate pulses with a simple circuit configuration and with low power consumption.

According to the present invention, in the configuration described above, the first power source may be connected via the switch to the output point of the selection voltage feed circuit. With this configuration, it is possible to feed stepwise gate pulses with a simple circuit configuration and with low power consumption.

According to the present invention, in the configuration described above, the pixel transistors may be formed of amorphous silicon. With this configuration, now that the conventionally encountered problem of degraded image quality attributable to the voltage shift ($\Delta V1$ in FIG. 6) has been solved, even when amorphous silicon is used instead of low-temperature polysilicon, resulting in the liquid crystal display panel having lower image quality, it is possible not only to compensate for this loss in image quality but also to reduce the number of steps involved in the manufacturing process. This makes it possible to manufacture large-screen liquid crystal display panels inexpensively.

According to the present invention, in the configuration described above, the selection voltage feed circuit may be provided separately from the gate driver. With this configuration, even when a large current flows though the selection voltage feed circuit, causing it to dissipate a large amount of heat, it is easy to cool it.

According to the present invention, in the configuration described above, the selection voltage feed circuit may be arranged, along with a low-level gate voltage source, outside the gate driver. With this configuration, even when a large current flows though the selection voltage feed circuit, causing it to dissipate a large amount of heat, it is easy to cool it.

According to the present invention, in the configuration described above, as the switch, a plurality of switches are provided one for each gate line, in parallel with one another. With this configuration, it is possible to arrange, as the switch, a plurality of small switches in a distributed fashion in parallel with one another. This helps reduce the overall power consumption, and makes it possible to integrate the switch into the gate driver.

BEST MODE FOR CARRYING OUT THE INVENTION

First Embodiment

Figure 1:
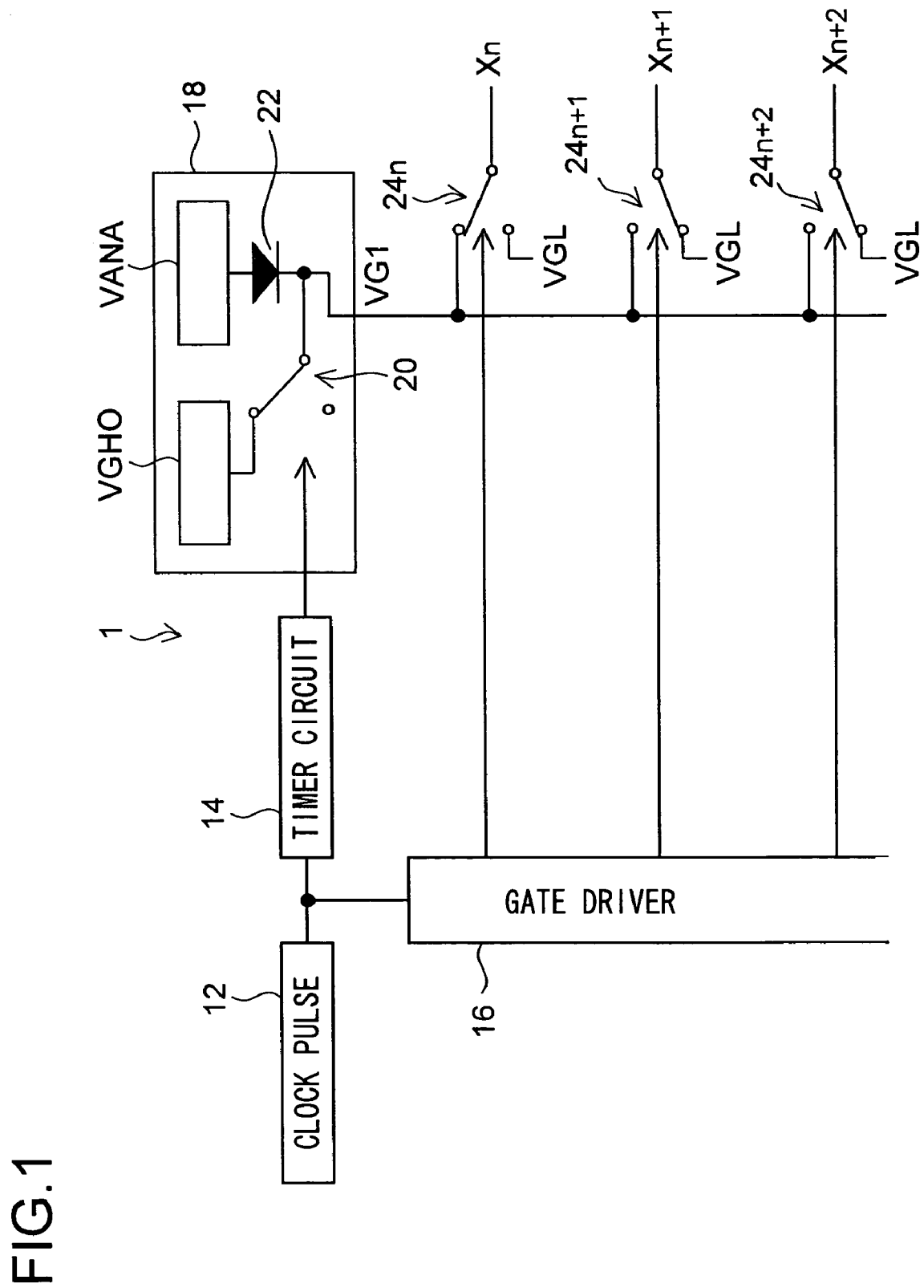
FIG. 1 is a diagram showing the drive circuit of the active matrix type liquid crystal display device of a first embodiment of the invention.
Figure 2:
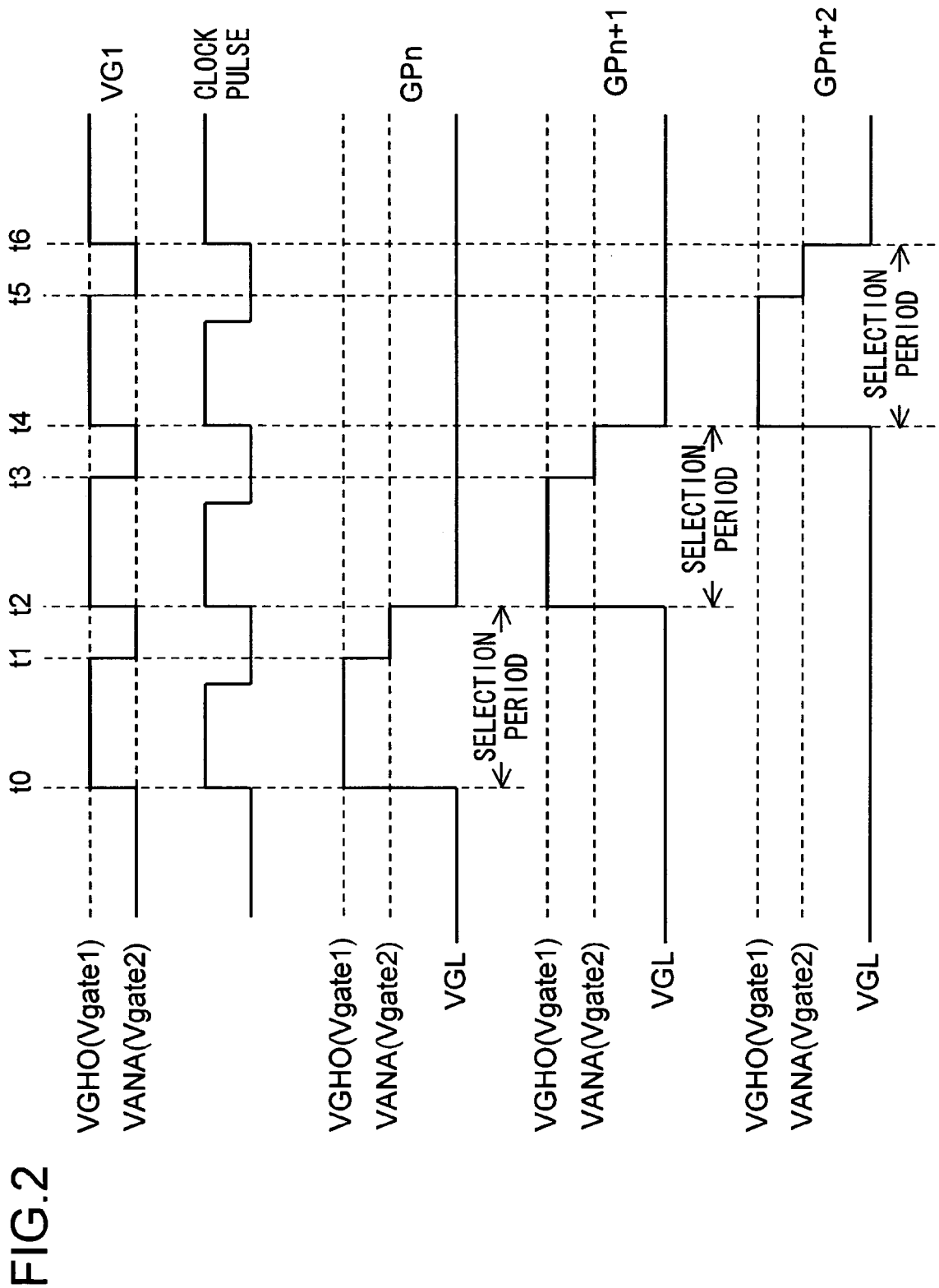
FIG. 2 is a diagram showing the waveforms observed at relevant points in FIG. 1.
Figure 3:
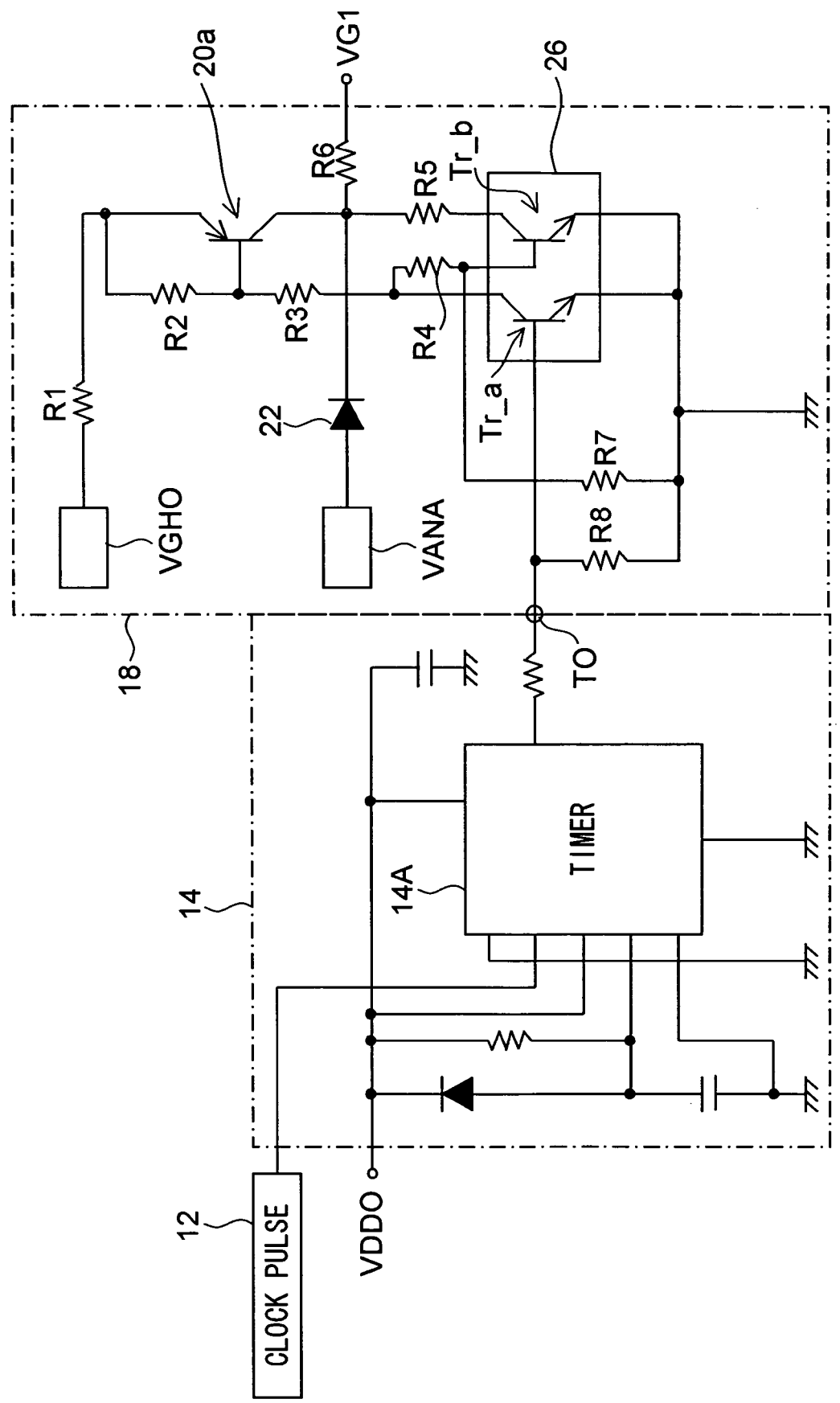
FIG. 3 is a diagram showing a practical example of the circuit configuration of the selection voltage feed circuit shown in FIG. 1.

Hereinafter, a first embodiment of the present invention will be described in detail with reference to FIGS. 1 to 3. FIG. 1 is a diagram showing the drive circuit 1 of the active matrix type liquid crystal display device of the first embodiment of the invention, FIG. 2 is a diagram showing the waveforms observed at relevant points in FIG. 1, and FIG. 3 is a diagram showing a practical example of the circuit configuration of the selection voltage feed circuit 18 shown in FIG. 1.

Figure 5:
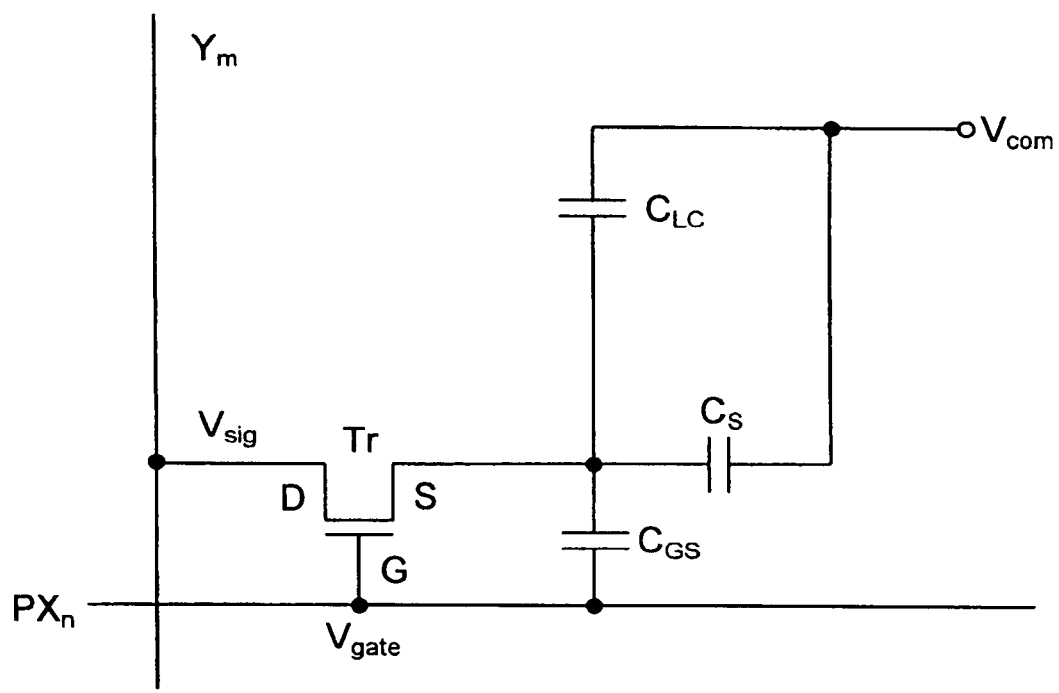
FIG. 5 is an equivalent circuit diagram schematically showing a portion corresponding to one pixel in a typical configuration of a conventional active matrix type liquid crystal display device.

The active matrix type liquid crystal display device of this embodiment, and also that of the later-described second embodiment, has a liquid crystal panel, which has liquid crystal pixels arrayed in a matrix (for example, composed of A columns and B rows (where A and B are natural numbers)), with each liquid crystal pixel located at the intersection between a gate line PXn (where n is a natural number equal to or smaller than A) an a signal line (source line) Ym (where m is a natural number equal to or smaller than B) on the liquid crystal panel, just as in the conventional example described earlier with reference to FIG. 5.

The pixel transistors that drive the liquid crystal pixels respectively and the signal lines that are connected to the drain electrodes of those pixel transistors also are the same as those used in the conventional example described earlier with reference to FIG. 5, and are therefore omitted there. The gate lines Xn too are the same as their counterpart PXn in FIG. 5 except that, here, they are connected to the gate electrodes of the pixel transistors provided in the drive circuit 1 of the active matrix type liquid crystal display device of this embodiment.

First, with reference to FIG. 1, the drive circuit of the active matrix type liquid crystal display device of the first embodiment of the invention will be described. The drive circuit 1 of the active matrix type liquid crystal display device includes: a timer circuit 14 that receives clock pulses 12 (with a duty factor of 50%) from a nonillustrated CPU (central processing unit); and a gate driver 16 built as a shift register. It further includes: a selection voltage feed circuit 18 that receives the output of the timer circuit 14; gate lines Xn, Xn+1, Xn+2, . . . (where n is a natural number) that are connected to the gate electrodes of the pixel transistors (not illustrated) respectively; gate pulse control switches 24n, 24n+1, 24n+2, . . . that are connected to the gate lines Xn, Xn+1, Xn+2, . . . respectively; and a low-level gate voltage source VGL.

The selection voltage feed circuit 18 includes: a first power source VGH0 that feeds a first high-level gate voltage Vgate1; a second power source VAVA that feeds a voltage Vgate2 lower than the first high-level gate voltage Vgate1; a diode 22 of which the anode is connected to the output of the second power source VAVA and of which the cathode is connected to the output point VG1 of the selection voltage feed circuit 18; and a switch 20 that turns on and off the connection between the output point of the first power source VGH0 and the cathode of the diode 22 in response to the output of the timer circuit 14. The output point VG1 of the selection voltage feed circuit 18 is also connected to one end of each of the gate pulse control switches 24n, 24n+1, 24n+2, . . . .

The gate driver 16 feeds control signals individually to the gate pulse control switches 24n, 24n+1, 24n+2, . . . so that, according to those control signals, either the output voltage of the selection voltage feed circuit 18 or the output voltage of the low-level gate voltage source VGL is applied to, for example, the gate line Xn. The same control is performed for each of the other gate lines (i.e., the gate lines Xn+1, Xn+2, . . . ).

When either the first high-level gate voltage Vgate1 or the second high-level gate voltage Vgate2 is applied to the gate electrode of a given pixel transistor, this pixel transistor turns on. By contrast, when the voltage outputted from the low-level gate voltage source VGL is applied to the gate electrode of a given pixel transistor, this pixel transistor turns off.

The timer circuit 14 starts to count in response to the rising edge of a clock pulse 12 from the CPU, and stops counting later than the falling edge of that clock pulse but earlier than the rising edge of the next clock pulse. In other words, the length of time that elapses after the timer circuit 14 starts one round of counting until it ends it is longer than half a clock period of the clock pulses 12 but shorter than one clock period of the clock pulses 12.

According to the output of this timer circuit 14, the switch 20 of the selection voltage feed circuit 18 is controlled so that the voltage at the output point VG1 of the selection voltage feed circuit 18 is switched between the first high-level gate voltage Vgate1 and the second high-level gate voltage Vgate2, which is lower than Vgate1.

More specifically, the switch 20 is controlled by the output of the timer circuit 14 in such a way that, while the timer circuit 14 is counting, the voltage that appears at the output point VG1 of the selection voltage feed circuit 18 is the first high-level gate voltage Vgate1, and, while the timer circuit 14 is not counting, the voltage that appears at the output point VG1 of the selection voltage feed circuit 18 is the second high-level gate voltage Vgate2.

Next, with reference to FIG. 2, the waveforms observed at relevant points in FIG. 1 will be described. In FIG. 2 are shown the waveforms of, from above, the voltage that appears at the output point VG1 of the selection voltage feed circuit 18, the clock pulses 12, the voltage (gate pulse GPn) applied to the gate line Xn, the voltage (gate pulse GPn+1) applied to the gate line Xn+1, and the voltage (gate pulse GPn+2) applied to the gate line Xn+2.

As shown in FIG. 2, every time a clock pulse 12 rises (at time points t0, t2, t4, and t6), the timer circuit 14 starts to count, causing the first high-level gate voltage Vgate1 to appear as the voltage at the output point VG1 of the selection voltage feed circuit 18. After rising to a high level, the clock pulse 12 first falls to a low level, and then, before the next clock pulse rises, the timer circuit 14 finishes and stops counting (at time points t1, t3, and t5) as described above. Thus, after the timer circuit 14 finishes counting until it starts to count next time (at the time points t2, t4, and t6), the second high-level gate voltage Vgate2 appears as the voltage at the output point VG1 of the selection voltage feed circuit 18.

The periods between the time points t0 and t2, between the time points t2 to t4, and between the time points t4 and t6 are, respectively, the selection period of a pixel that is driven by the voltage that is applied to the gate line Xn (this period can thus be said to be the selection periods of the gate line Xn), the selection period of a pixel that is driven by the voltage that is applied to the gate line Xn+1 (this period can thus be said to be the selection periods of the gate line Xn+1), and the selection period of a pixel that is driven by the voltage that is applied to the gate line Xn+2 (this period can thus be said to be the selection periods of the gate line Xn+2).

Figure 6:
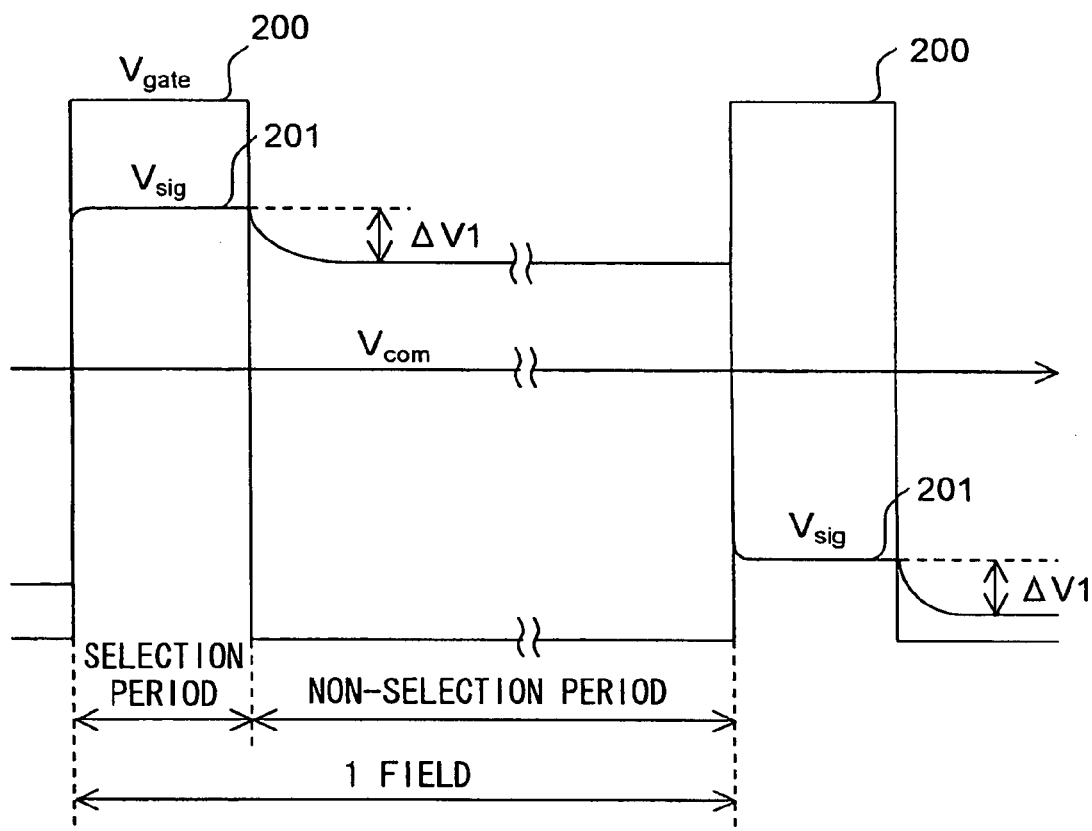
FIG. 6 is a diagram showing the voltage waveforms observed at relevant points within a pixel of a conventional active matrix type liquid crystal display device.
Figure 7:
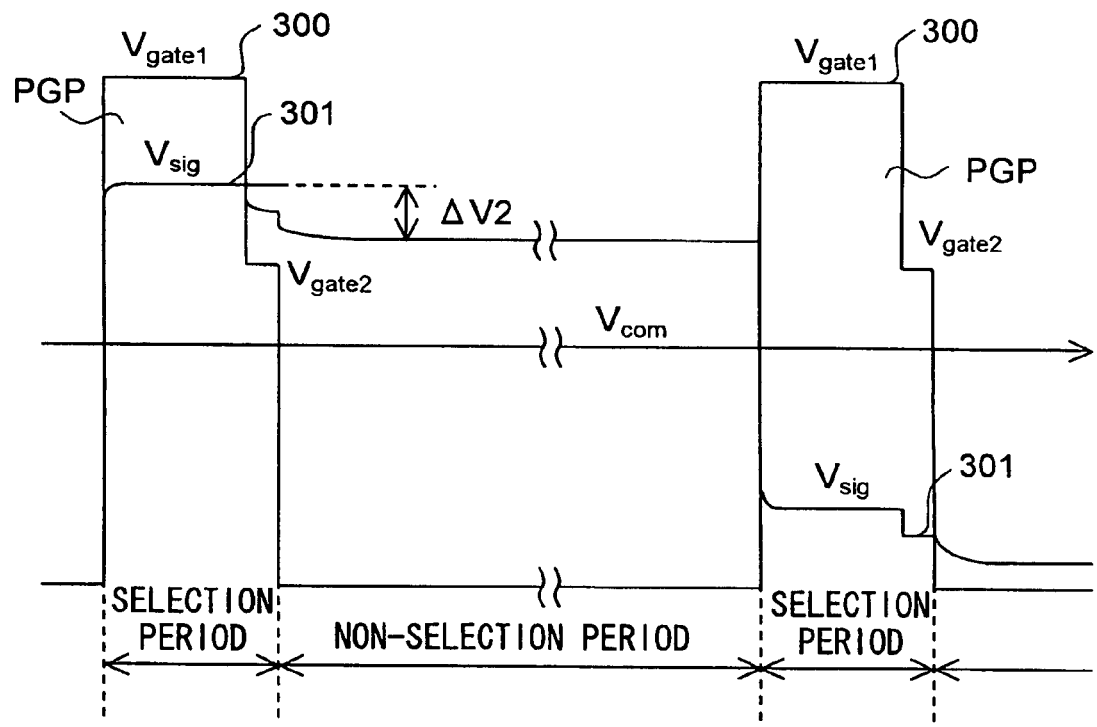
FIG. 7 is a diagram showing an approach to solving the problem of the voltage shift encountered in a conventional active matrix type liquid crystal display device.
Figure 8:
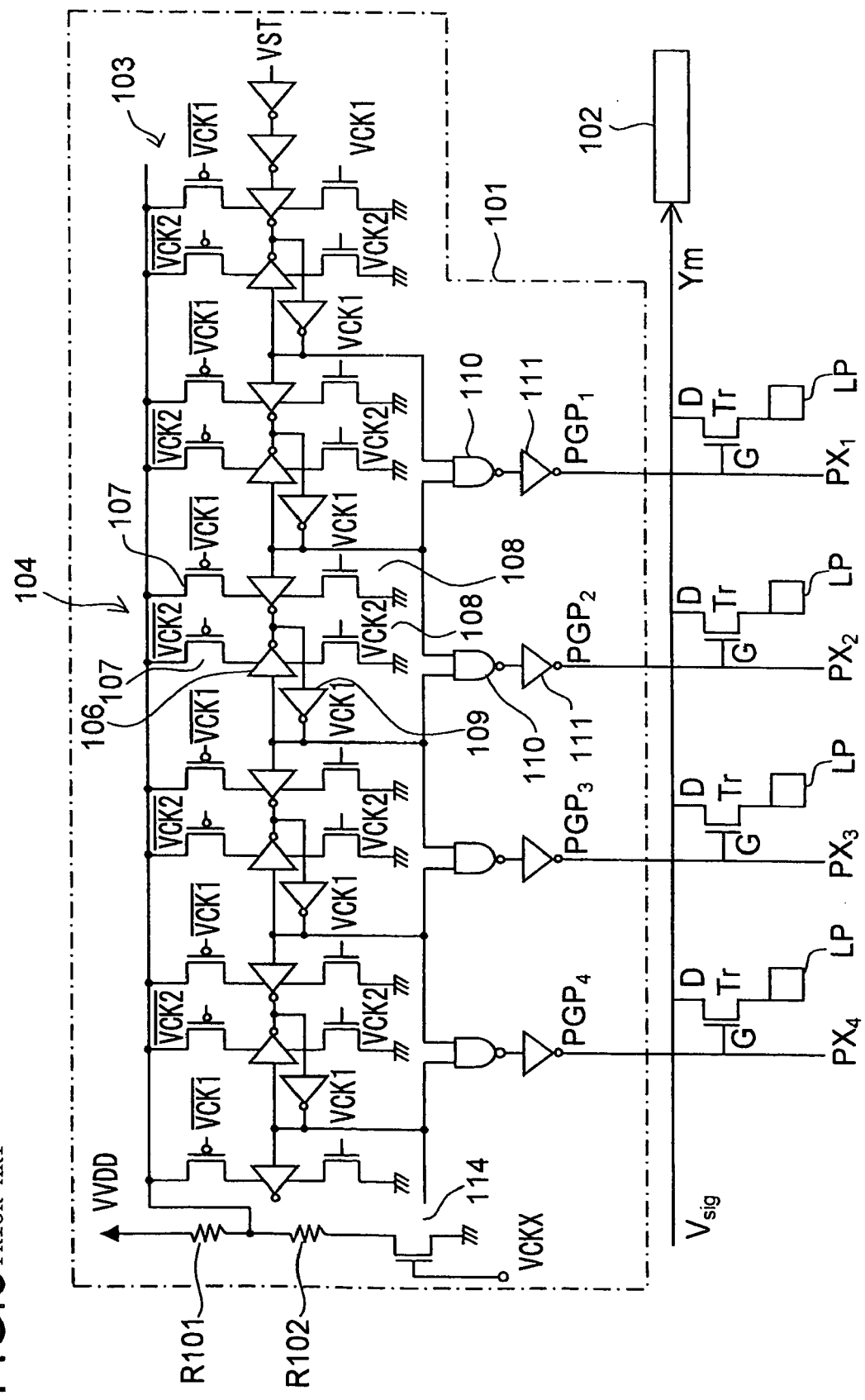
FIG. 8 is a diagram showing a practical example of the drive circuit for implementing the approach shown in FIG. 7.

Back in FIG. 1, the clock pulses 12 from the CPU are fed also to the gate driver 16 built as a shift register. Thus, the gate driver 16 so operates that, within the period of one field (see FIG. 6), in synchronism with the rising edge of one clock pulse 12 after another from the CPU, one of the gate lines Xn, Xn+1, Xn+2, . . . after another is selected, in a line-by-line fashion, by the gate pulse control switches 24n, 24n+1, 24n+2, . . . respectively. Thus, during the selection period of a given gate line (Xn is being selected in FIG. 1), this gate line is connected to the output point VG1 of the selection voltage feed circuit 18, with all the other gate lines (Xn+1, Xn+2, etc. in FIG. 1) connected to the low-level gate voltage source VGL.

Accordingly, as shown in FIG. 2, the gate pulse GPn that is applied to whichever of the gate lines Xn has reached its selection period within one period first rises sharply from the voltage fed from the low-level gate voltage source VGL, which is a low-level voltage source, to the first high-level gate voltage Vgate1 (at the time point t0), then, a predetermined period thereafter, lowers to the second high-level gate voltage Vgate2 (at the time point t1), then, at the end of the selection period, falls sharply to the voltage fed from the low-level gate voltage source VGL (at the time point t2), and then remains at this voltage until the same gate line reaches its selection period in the next field. Subsequently, during the selection period of one of the remaining gate lines Xn+1, Xn+2, . . . after another, stepwise gate pulses GPn+1, GPn+2, . . . similar to GPn are applied thereto respectively.

In this embodiment, for example, the length of one selection period (the periods between the time points t0 to t2, etc.) are set at 13.5 µs, the periods between the time points t0 and t1, between the time points t2 to t3, and between the time points t4 to t5 are set at 11 µs, and the periods between the time points t1 and t2, between the time points t3 to t4, and between the time points t5 to t6 are set at 2.5 µs. Moreover, for example, the first high-level gate voltage Vgate1 fed from the first power source VGH0 is set at 25 V, and the second high-level gate voltage Vgate2 fed from the second power source VANA is set at 13 V. Needless to say, the values specifically mentioned above for the relevant periods (13.5 µs, etc.) and voltages (25 V, etc.) are not intended to limit the present invention in any way.

Next, with reference to FIG. 3, a practical example of the circuit configuration of the selection voltage feed circuit 18 shown in FIG. 1 will be described. Here, such components as are found also in FIG. 1 are identified with the same reference numerals and symbols, and their explanations will not be repeated.

The output of the first power source VGH0 is connected through a resistor R1 to the emitter of a PNP-type transistor 20a, and the collector of the transistor 20a is connected through a resistor R5 to the collector of an NPN-type transistor Tr_b. The emitter of the transistor 20a is connected through resistors R2, R3, and R4 to the base of the transistor Tr_b, with the node between the resistors R2 and R3 connected to the base of the transistor 20a, and with the node between the resistors R3 and R4 connected to the collector of an NPN-type transistor Tr_a. The base of the transistor Tr_b is grounded through a resistor R7, and the emitters of the transistors Tr_a and Tr_b are both grounded.

The base of the transistor Tr_a is grounded through a resistor R8, and is connected to the output (TO in the figure) of the timer circuit 14.

The output of the second power source VANA is connected through the diode 22 to the collector of the transistor 20a, and the collector of the transistor 20a is connected through a resistor R6 to the output point VG1 of the selection voltage feed circuit 18.

The transistors Tr_a and Tr_b together constitute a level shift circuit 26 that, as those transistors are switched, shifts the voltage at the output point VG1 of the selection voltage feed circuit 18. The timer circuit 14 includes a timer element 14A for counting time, and receives a supply voltage VDD0 and clock pulses 12. The transistor 20a is what embodies the switch 20 shown in FIG. 1.

As will be understood from the interconnection described above, the second power source VANA, which feeds the second high-level gate voltage Vgate2, is connected via the diode 22 to the output point VG1 of the selection voltage feed circuit 18, and the first power source VGH0, which feeds the first high-level gate voltage Vgate1, is connected via the switch 20, to which the output of the timer circuit 14 is connected via the level shift circuit 26, also to the output point VG1. That is, since the second power source VANA is always connected via the diode 22 to the output point VG1 of the selection voltage feed circuit 18, outputted as the voltage that appears at the output point VG1 is, when the transistor 20a is off, the voltage fed from the second power source VANA, namely the second high-level gate voltage Vgate2, and, when the transistor 20a is on, the voltage fed from the first power source VGH0, namely first high-level gate voltage Vgate1.

The resistances of the resistors are so set that, while the timer circuit 14 is counting, the timer circuit 14 outputs a high-level voltage that keeps the transistor Tr_a on and the transistor Tr_b off and in addition the voltage drop across the resistor R2 keeps the transistor 20a on. Moreover, the resistances of the resistors are so set that, while the timer circuit 14 is not counting, the timer circuit 14 outputs a low-level voltage that keeps the transistor Tr_a off and the transistor Tr_b on and in addition that the transistor 20a does not turn on due to a voltage drop across the resistor R2.

Accordingly, while the timer circuit 14 is counting, the transistor 20a is on, and therefore the voltage that appears at the output point VG1 of the selection voltage feed circuit 18 is the first high-level gate voltage Vgate1; while the timer circuit 14 is not counting, the transistor 20a is off, and therefore the voltage that appears at the output point VG1 of the selection voltage feed circuit 18 is the second high-level gate voltage Vgate2.

As described above, the PNP-type transistor 20a is merely one example that embodies the switch 20 shown in FIG. 1. Needless to say, the present invention is not limited to implementation where a PNP-type transistor 20a is adopted as the switch 20; instead, an NPN-type transistor, relay, or the like may be adopted as the switch 20, with the circuit configuration so modified as to achieve the same effects as those achieved by the configuration shown in FIG. 3.

As described above, in this embodiment, it is possible to apply a stepwise gate pulse voltage during the selection period of each gate line. Thus, it is possible to solve the problem of the voltage shift (corresponding to ΔV1 in FIG. 6) inevitable in a conventional active matrix type liquid crystal display device. Moreover, a voltage corresponding to the second high-level gate voltage Vgate2 is always fed from the second power source VANA via the diode 22 to the output point VG1 of the selection voltage feed circuit 18, and, while the timer circuit 14 is counting, the switch 20 is kept on so that a voltage corresponding to first high-level gate voltage Vgate1 is fed from the first power source VGH0 to the output point VG1 of the selection voltage feed circuit 18. Thus, the high-level gate voltages can be switched without loss and without causing a surge voltage.

Moreover, logic circuits such as the timer circuit 14 and the gate driver 16 can operate from a voltage of 5 V or less. This helps greatly reduce the power consumption as compared with the configuration disclosed in Patent Publication 1 mentioned earlier.

The configuration of this embodiment can be described alternatively as follows: "there are previously provided a first power source VGH0 for generating a voltage corresponding to a first high-level gate voltage Vgate1 and a second power source VANA for generating a voltage corresponding to a second high-level gate voltage Vgate2 that is a predetermined voltage lower than the first high-level gate voltage Vgate1; while the second high-level gate voltage Vgate2 from the second power source VANA is always fed via a diode, the first high-level gate voltage Vgate1 is turned on and off so as to be superimposed on the second high-level gate voltage Vgate2.

In the first embodiment described above, one switch 20 is used in the selection voltage feed circuit 18. In this configuration, a large current flows through the switch 20, and accordingly, considering the heat dissipated there, it is preferable that the selection voltage feed circuit 18 be provided separately from the gate driver 16. This makes it easy to cool the selection voltage feed circuit 18 even when a large current flows therethrough causing it to dissipate a large amount of heat. For similar reasons, the low-level gate voltage source VGL may be provided separately from the gate driver 16.

In the above description, "providing separately" means, when the gate driver 16 and other components are integrated into an IC (integrated circuit), assembling into separate ICs the gate driver 16 from the selection voltage feed circuit 18 and/or the low-level gate voltage source VGL. Even in a case where the gate driver 16 is assembled into the same single IC as the selection voltage feed circuit 18 and/or the low-level gate voltage source VGL, if the physical distance from the gate driver 16 to the selection voltage feed circuit 18 and/or the low-level gate voltage source VGL is made sufficiently long to permit easy cooling as described above, doing so can be understood as equivalent to "providing separately" as meant in the above description. The expression "the selection voltage feed circuit 18 or the low-level gate voltage source VGL is provided separately from the gate driver 16" is interchangeable with the expression "the selection voltage feed circuit 18 or the low-level gate voltage source VGL is arranged outside the gate driver 16."

Second Embodiment

Figure 4:
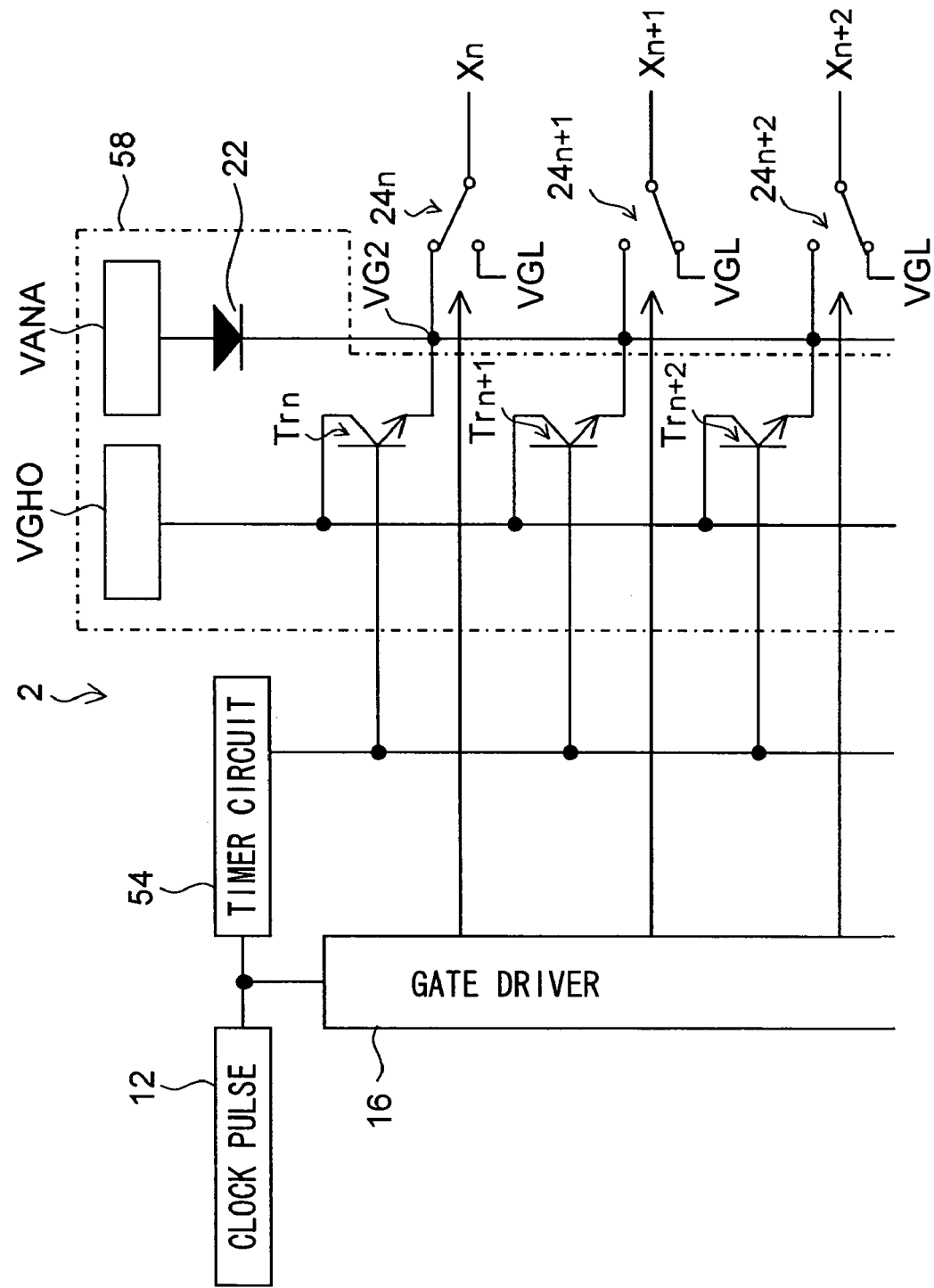
FIG. 4 is a diagram showing the drive circuit of the active matrix type liquid crystal display device of a second embodiment of the invention.

As a second embodiment of the present invention, a modified example where the above-mentioned problem of heat dissipation has been resolved to permit a selection voltage feed circuit (specifically, the selection voltage feed circuit 58 described later) to be built into the gate driver 16 is shown in FIG. 4. FIG. 4 is a diagram showing the drive circuit 2 of the active matrix type liquid crystal display device of the second embodiment of the invention. Here, such components as are found also in FIG. 1 are identified with the same reference numerals and symbols, and their explanations will not be repeated.

The configuration shown in FIG. 4 differs from that shown in FIG. 1 in the following respects. Instead of the timer circuit 14, a timer circuit 54 is used that has a circuit corresponding to the level shift circuit 26 built into the timer circuit 14. Along with the gate driver 16, a plurality of NPN-type switching transistors Trn, Trn+1, Trn+2, . . . are arranged in a distributed fashion parallel to one another, one for each gate line. The bases of these switching transistors Trn, Trn+1, Trn+2, . . . are together connected to the output of the level shift circuit provided within the timer circuit 54; the collectors of those transistors are together connected to the first power source VGH0; and the emitters of those transistors are connected to the nodes between the output point VG2 of the selection voltage feed circuit 58, which is connected via the diode 22 to the second power source VANA, and one ends of the gate pulse control switches 24n, 24n+1, 24n+2, . . . respectively.

The selection voltage feed circuit 58 is the same as the selection voltage feed circuit 18 shown in FIG. 1 except that the switch 20 used in FIG. 1 is replaced with the switching transistors Trn, Trn+1, Trn+2, . . . mentioned above. And the output point VG2 of the selection voltage feed circuit 58 corresponds to the output point VG1 of the selection voltage feed circuit 18.

The output of the level shift circuit of the timer circuit 54 is used as the output of the timer circuit 54 itself, and the timer circuit 54 is the same as the timer circuit 14 except that it has the level shift circuit built into itself. Accordingly, like the timer circuit 14, the timer circuit 54 starts to count in response to the rising edge of a clock pulse 12 from the CPU, and stops counting later than the falling edge of that clock pulse but earlier than the rising edge of the next clock pulse.

By the output of this timer circuit 54, the switching transistors Trn, Trn+1, Trn+2, . . . are controlled in such a way that the voltage at the output point VG2 of the selection voltage feed circuit 58 is switched between the first high-level gate voltage Vgate1 and the second high-level gate voltage Vgate2, which is lower than that.

Specifically, as with the timer circuit 14, the switching transistors Trn, Trn+1, Trn+2, . . . are controlled by the output of the timer circuit 54 in such a way that, while the timer circuit 54 is counting, the voltage that appears at the output point VG2 of the selection voltage feed circuit 58 is the first high-level gate voltage Vgate1 and, while the timer circuit 54 is not counting, the voltage that appears at the output point VG2 of the selection voltage feed circuit 58 is the second high-level gate voltage Vgate2.

In this second embodiment, a voltage corresponding to the second high-level gate voltage Vgate2 from the second power source VANA is always applied to the output point VG2 of the selection voltage feed circuit 58, and, while the timer circuit 54 is counting, more than one of the switching transistors Trn, Trn+1, Trn+2, . . . are turned on by the output of the level shift circuit provided in the timer circuit 54 so that the first high-level gate voltage Vgate1 from the first power source VGH0 is applied to the output point VG2 of the selection voltage feed circuit 58.

Here, since the switching transistors Trn, Trn+1, Trn+2, . . . are arranged in parallel with one another, the amount of current that flows through each of them, and hence the amount of heat dissipated by each of them, decreases inversely with the number of them. This makes it possible to build the selection voltage feed circuit 58 integrally with the gate driver 16. Needless to say, of the entire selection voltage feed circuit 58, only the switching transistors Trn, Trn+1, Trn+2, . . . may be built integrally with the gate driver 16. As a matter of course, the second embodiment achieves the same effects as those, including lossless switching of the high-level gate voltages, described earlier in connection with the first embodiment.

In FIG. 4, there are provided as many switching transistors Trn, Trn+1, Trn+2, . . . as there are gate lines Xn, Xn+1, Xn+2, . . . . This exact configuration does not necessarily have to be adopted; it is possible to provide any number of switching transistors Trn, Trn+1, Trn+2, . . . provided that, when they are arranged integrally with the gate driver 16, the effect of the heat they dissipate can be ignored.

In the above description, "building integrally" and "arranging integrally," contrary to "providing separately" used earlier, mean, when the gate driver 16 and other components are integrated into an IC, assembling the gate driver 16 and the selection voltage feed circuit 18 into the same single IC. Even in a case where the gate driver 16 and the selection voltage feed circuit 18 are assembled into physically separate ICs, if these ICs are substantially built into a single part, as by being molded together, doing so can be understood as equivalent to "building integrally" and "arranging integrally" as meant in the above description.

In the first and second embodiments described above, it is preferable that the pixel transistors be built as TFTs, and that these TFTs be formed of amorphous silicon. In both the embodiments, the conventionally encountered problem of degraded image quality attributable to the voltage shift (corresponding to $\Delta V1$ in FIG. 6) has been solved. Accordingly, even when amorphous silicon is used instead of low-temperature polysilicon, resulting in the liquid crystal display panel having lower image quality, it is possible not only to compensate for this loss in image quality but also to reduce the number of steps involved in the manufacturing process. This makes it possible to manufacture large-screen liquid crystal display panels inexpensively.

INDUSTRIAL APPLICABILITY

As described above, according to the present invention, it is possible to realize an active matrix type liquid crystal display device that operates with low power consumption, that has a simple circuit configuration, that achieves switching without producing a surge voltage, that produces stably stepwise shifting gate pulses, and that thus offers good display quality.

The invention claimed is:

1. An active matrix type liquid crystal display device comprising:
   pixel electrodes that are arranged in a matrix and that are driven by pixel transistors respectively;
   a plurality of gate lines that are connected, in a column-by-column fashion, to gate electrodes of the pixel transistors;
   a plurality of source lines that are connected, in a row-by-row fashion, to source electrodes of the pixel transistors;
   a gate driver that, sequentially during one selection period after another, connects one of the gate lines after another to an output point of a selection voltage feed circuit; and
   a source driver that feeds an image signal to the source lines,
   wherein the selection voltage feed circuit has:
   a first power source for feeding a predetermined selection voltage;
   a diode; and
   a switch,
   wherein the switch is provided between the first power source and the output point of the selection voltage feed circuit, and the diode has an anode thereof connected to a second power source and having a cathode thereof connected between the output point of the selection voltage feed circuit and the switch, and
   wherein the switch being kept on from a start of the selection period for a time span shorter than the selection period.

2. The active matrix type liquid crystal display device of claim 1,
   wherein the pixel transistors are formed of amorphous silicon.

3. The active matrix type liquid crystal display device of claim 1,
   wherein the selection voltage feed circuit is provided separately from the gate driver.

4. The active matrix type liquid crystal display device of claim 1,
   wherein the selection voltage feed circuit is arranged, along with a low-level gate voltage source, outside the gate driver.

5. The active matrix type liquid crystal display device of claim 1,
   wherein, as the switch, a plurality of switches are provided one for each gate line, in parallel with one another.

6. An active matrix type liquid crystal display device comprising:
   pixel electrodes that are arranged in a matrix and that are driven by pixel
   transistors respectively;
   a plurality of gate lines that are connected, in a column-by-column fashion, to gate electrodes of the pixel transistors;
   a plurality of source lines that are connected, in a row-by-row fashion, to source electrodes of the pixel transistors;
   a gate driver that, sequentially during one selection period after another, connects one of the gate lines after another to an output point of a selection voltage feed circuit; and
   a source driver that feeds an image signal to the source lines,
   wherein the selection voltage feed circuit has a first power source for feeding a predetermined selection voltage, and a second power source for feeding a voltage lower than the predetermined selection voltage, and a switch is provided that so operates that, during a time span that starts at a beginning of every selection period and lasts shorter than the selection period, the output point of the selection voltage feed circuit is fed with the voltage from the first power source,
   wherein as the switch, a plurality of switches are provided one for each gate line in parallel with one another, and
   wherein, during a time span that falls within the selection period and during which the voltage from the first power source is not fed to the output point of the selection voltage feed circuit, the voltage from the second power source is fed to the output point of the selection voltage feed circuit.

* * * * *